United States Patent

Bussan et al.

[11] Patent Number: 5,711,001
[45] Date of Patent: Jan. 20, 1998

[54] METHOD AND CIRCUIT FOR ACQUISITION BY A RADIO RECEIVER

[75] Inventors: Christopher F. Bussan, Mundelein; Patrick J. Marry, Crystal Lake; Duane C. Rabe, Hawthorn Woods, all of Ill.; Charles P. Binzel, Bristol, Wis.; Arvind S. Arora, Arlington Heights, Ill.

[73] Assignee: Motorola, Inc., Schaumburg, Ill.

[21] Appl. No.: 657,694

[22] Filed: May 29, 1996

Related U.S. Application Data

[63] Continuation of Ser. No. 268,389, Jun. 30, 1994, abandoned, which is a continuation of Ser. No. 880,808, May 8, 1992, abandoned, and Ser. No. 379,858, Jan. 27, 1995, abandoned, which is a continuation of Ser. No. 51,108, Apr. 21, 1993, abandoned.

[51] Int. Cl.[6] .................. H04B 7/26; H04Q 7/22
[52] U.S. Cl. ............... 455/432; 455/434; 455/455; 455/161.3
[58] Field of Search ................... 455/33.1, 33.2, 455/33.4, 34.1, 34.2, 53.1, 54.1, 56.1, 62, 63, 161.1, 161.2, 161.3, 422, 432, 434, 435, 450, 452, 455; 379/59, 60

[56] References Cited

U.S. PATENT DOCUMENTS

| | | | |
|---|---|---|---|
| 4,783,780 | 11/1988 | Alexis | 370/95 |
| 4,903,320 | 2/1990 | Hanawa | 455/33.1 |
| 4,905,301 | 2/1990 | Krolopp et al. | 455/34.1 |
| 5,119,502 | 6/1992 | Kallin et al. | 455/34.2 |
| 5,203,012 | 4/1993 | Patsiokas et al. | 455/34.1 |
| 5,276,905 | 1/1994 | Hurst et al. | 455/33.1 |

FOREIGN PATENT DOCUMENTS

| | | |
|---|---|---|
| 0 243 885 A2 | 11/1987 | European Pat. Off. |
| 0 283 955 A2 | 9/1988 | European Pat. Off. |
| 0 420 505 A2 | 4/1991 | European Pat. Off. |
| 0 420 508 A2 | 4/1991 | European Pat. Off. |
| 0 440 436 A2 | 8/1991 | European Pat. Off. |
| 0 522 885 A2 | 1/1993 | European Pat. Off. |
| 2 124 148 | 11/1971 | Germany. |
| 2 228 327 | 12/1973 | Germany. |
| 2 402 562 | 7/1975 | Germany. |

*Primary Examiner*—Reinhard J. Eisenzopf
*Assistant Examiner*—Thanh Le
*Attorney, Agent, or Firm*—Daniel W. Juffernbruch

[57] ABSTRACT

A method and associated circuitry for acquiring a channel of a set of frequency channels by a radio receiver. The radio receiver scans selected control channels and measures the power levels of signals generated upon the respective ones of the control channels and stores values. An attempt to effectuate a communication link with a transmitter which transmits a data signal upon one of the control channels is only attempted if the measured power level on such control channel increases beyond a certain amount. The tuning frequency of the tuning circuitry can be retuned when the tuning circuitry is initially tuned to receive a communication signal transmitted by a transmitter of a less-than-most desired network of transmitters according to a second embodiment.

30 Claims, 6 Drawing Sheets

| $V_1$ | $V_2$ | $D_1$ | $V_3$ | $V_4$ | $V_5$ | $V_6$ | $D_2$ | ·········· | $V_{n-2}$ | $V_{n-1}$ | $D_{n-1}$ | $V_n$ | $D_n$ |

| $V_1$ | $D_1$ | $V_2$ | .... | $V_n$ | $D_n$ | $V_1$ | $D_1$ | .... | $V_n$ | $D_n$ |

METHOD AND CIRCUIT FOR ACQUISITION BY A RADIO RECEIVER

CROSS-REFERENCE TO RELATED APPLICATIONS

This application is a continuation of U.S. Ser. No. 08/268,389 filed on Jun. 30, 1994, now abandoned, which is a continuation of U.S. Ser. No. 07/880,808 filed on May 8, 1992 now abandoned and U.S. Ser. No. 08/379,858 filed on Jan. 27, 1995 now abandoned, which is a continuation of U.S. Ser. No. 08/051,108 filed on Apr. 21, 1993 now abandoned.

BACKGROUND OF THE INVENTION

The present invention relates generally to radio receivers and, more particularly, to a method for acquiring a channel, and associated circuitry for implementing such.

A communication system is operative to transmit information between two or more locations, and includes, at a minimum, a transmitter and a receiver interconnected by a communication channel. A radio communication system is a communication system in which the communication channel comprises a radio frequency channel wherein the radio frequency channel is defined by a range of frequencies of the communication spectrum.

The transmitter which forms a portion of the radio communication system includes circuitry for converting the information into a form suitable for transmission thereof upon a radio frequency channel. Such circuitry includes modulation circuitry which performs a process referred to as modulation. In such a process, the information which is to be transmitted is impressed upon a radio frequency electromagnetic wave, commonly referred to as a carrier signal. The resultant signal is commonly referred to as a modulated signal. Such resultant signal is also referred to as a communication signal as the modulated signal includes the information which is to be communicated between the transmitter and the receiver.

Various modulation schemes are known for impressing the information upon the carrier signal to form thereby the communication signal. For instance, amplitude modulation, frequency modulation, phase modulation, and combinations thereof are all modulation schemes by which information may be impressed upon a carrier wave to form the communication signal.

Radio communication systems are advantageous in that no physical interconnection is required between the transmitter and the receiver; once the information signal is modulated to form a modulated signal, the modulated signal may be transmitted over large distances.

Additionally, numerous modulated signals may be simultaneously transmitted at different frequencies of the electromagnetic frequency spectrum. Transmission of communication signals on frequency channels defined upon certain frequency bands of the electromagnetic frequency spectrum are regulated by regulatory bodies.

A two-way, radio communication system is a radio communication system, similar to the radio communication system above-described, but which further permits both transmission of information to a location, and transmission of information from that location. Each location of such a two-way, radio communication system contains both a transmitter and a receiver. The transmitter and the receiver positioned at a single location typically comprise a unit referred to as a radio transceiver, or, more simply, a transceiver.

A cellular communication system is a type of two-way radio communication system in which communication is permitted with a radio transceiver positioned at any location within a geographic area encompassed by the cellular communication system. A cellular communication system shall also be referred to by the term Public Land Mobile Network (PLMN) or "network" hereinbelow.

A cellular communication network is created by positioning a plurality of fixed-site radio transceivers, referred to as base stations, at spaced-apart locations throughout the geographic area. The base stations are connected to a conventional, wireline, telephonic network. Each base station has associated therewith a portion of the geographic area located proximate to each of such base stations. Such portions are referred to as cells. The plurality of cells, each defined by corresponding ones of the base stations of the plurality of base stations together define the coverage area of the cellular communication network.

A radio transceiver, referred to in a cellular communication network as a radiotelephone, positioned at any location within the coverage area of the cellular communication network is able to communicate with a user of the conventional, wireline, telephonic network by way of a base station. Communication signals generated by the radiotelephone are transmitted to a base station, and then, by way of the conventional, wireline, telephonic network to a desired wireline location to effectuate thereby telephonic communication therewith. Telephonic communication may also be effectuated with the radiotelephone upon initiation at the wireline location.

A conventional protocol of operation of most cellular communication networks determines to which of the base stations of the cellular communication system the radiotelephone transmits, and receives, communication signals. Effectuation of transmission of communication signals by a base station to a radiotelephone is referred to as a "communication down-link;" effectuation of transmission of communication signals by a radiotelephone is referred to as a "communication up-link."

The frequency channels into which the frequency band allocated for cellular communication are divided are further divided into control channels and traffic channels. In conventional, cellular communication systems, the control channels and traffic channels are defined to be of differing frequencies. In systems utilizing time division multiplexing techniques, the control and traffic channels may also be defined to be of similar frequency channels, but defined to be of dissimilar time slots therein.

The control channels are allocated for transmission of communication signals, here referred to as control signals, by the base stations. The radiotelephones are operative to scan the control channels (both during powering on of the radiotelephone and periodically during operation thereof). The power levels of the signals transmitted upon the control channels are ascertained, and responsive to such measured values, the radiotelephone attempts to ascertain the information content of the control signal generated upon one of the control channels. During such stage of signal transmission, if the information content of the control signal transmitted upon the selected control channel may be ascertained, and the information content of the control signal transmitted upon such control channel meets pre-defined criteria, a communication down-link is effectuated. The receiver circuitry of the radiotelephone remains tuned to the selected control channel. In essence, the radiotelephone tunes-in to the selected control channel, and "listens" to the information being transmitted thereupon. Such operation of the radiotelephone is sometimes referred to as "camping" of the radiotelephone, and once a communication down-link is effectuated between a base station and the radiotelephone, the radiotelephone is sometimes referred to as being "camped-to a base station (or cell site)."

Once the communication down-link has been effectuated between the radiotelephone and a base station, receiver circuitry of the radiotelephone may be powered-down, and only periodically powered-on again in a desired duty cycle. During periods in which the receiver circuitry is again powered, the information content of the control signal transmitted upon the selected control channel (i.e., the control channel to which the radiotelephone is "camped") is monitored. (It is noted that, at times, control signals may also be transmitted upon the traffic channel. Such control signals are typically transmitted, however, after a communication link has already been effectuated between the radiotelephone and the base station.)

Because the receiver circuitry is powered-on only periodically, energy consumption of such circuitry is minimized once a communication down-link has been effectuated with a base station.

When a call is being made to the radiotelephone, the information content of the control signal directs the radiotelephone to certain ones of the traffic channels whereupon voice communication may then commence.

Because of the increased popularity of use of such cellular communication systems, many of such cellular communication systems, at times, are operated at full capacity. That is to say, at times, every available traffic channel of the frequency band allocated for cellular communications is used. To provide access to greater numbers of users of such cellular communication systems, schemes have been developed to utilize more efficiently the frequency bands allocated for such use.

In particular, to increase capacity, cellular communication systems are being introduced which utilize more efficient modulation schemes. Modulation schemes which make use of discretely-encoded information signals more efficiently utilize the frequency channels allocated for cellular communications. Hence, use of such modulation schemes permit greater numbers of users to utilize simultaneously a cellular communication system. Such modulation schemes generate communication signals which are amendable to transmission utilizing the time-division multiplexing techniques noted briefly hereinabove.

Conventional, cellular communication systems and cellular communication systems of increased capacity are generally incompatible systems. That is to say, radiotelephones operative in a conventional, cellular communication system are not operative in a cellular communication system of increased capacity. (While dual mode radiotelephones are operative in either of the cellular communication systems, such dual mode radiotelephones include dual circuitry portions, with one circuitry portion operative in one system and another circuitry portion operative in the other system, whereby one or the other of the circuitry portions is operative depending upon the communication system in which the radiotelephone is to be operated.)

Two or more cellular communication systems are sometimes installed in certain geographical areas. For instance, both conventional and increased-capacity, cellular communication systems are installed in certain geographical areas providing cellular coverage in either of such systems. In other geographical areas, only conventional, cellular communication systems are installed. (A geographic area may, analogously, have only an increased-capacity system installed.) And, in still other geographical areas, no cellular communication systems are installed.

As noted previously, when the receiver circuitry of a radiotelephone is powered on, the radiotelephone searches control channels to detect the presence of a control signal transmitted thereupon. When the radiotelephone is positioned in a geographic area not having cellular coverage, such search of the control channels does not result in the detection of a signal transmitted by any base station.

Also, a radiotelephone constructed to be operative in a particular one of the cellular communication systems (i.e., a conventional, cellular communication system, or a cellular communication system of increased capacity), but positioned at a location having cellular coverage by another, but incompatible, cellular communication system also does not detect the presence of a control signal transmitted upon the defined control channels of the cellular communication system in which the radiotelephone is operative.

Because the frequency bands of conventional cellular communications systems and cellular communication systems of increased capacity are operative in frequency bands having overlapping frequencies, a radiotelephone, when searching the control channels, may detect the presence of a control signal transmitted by the other of the cellular communication systems. However, because the systems are incompatible, the information content of such a detected signal cannot be ascertained by such radiotelephone.

Different cellular communication networks are configured over various geographical areas. When different cellular communication networks are configured over various geographic areas, users of a first cellular communication network are sometimes also permitted to utilize a second, cellular communication network when the user of the first cellular communication system is positioned within the geographic area encompassed by the second cellular communication network. Oftentimes, different cellular communication networks are configured over contiguous geographic areas. When a user is positioned proximate to a boundary between two contiguously-positioned networks, more than one communication network may be accessed by the user. (To a user, then, the geographic areas encompassed by the contiguously-positioned cellular networks may appear to overlap somewhat.)

A user (sometimes referred to as a subscriber) usually enters into a billing arrangement with the operator of one cellular communication network, referred to as the Home Public Land Mobile Network (HPLMN) or home-network. And the operator of the cellular communication network may enter into an agreement with the operators of other cellular communication networks which permit subscribers to utilize such other cellular communication networks when positioned in the geographical areas encompassed by the other cellular communication networks. The other cellular communication networks are referred to as Visitor Public Land Mobile Networks (VPLMNs) or visitor-networks by the subscriber of the home-network.

However, the fees that a user is required to pay to communicate upon the different cellular communication networks typically varies, sometimes significantly. When a subscriber of the home-network utilizes a visitor-network, the fees required for such utilization typically exceed the fees required when the subscriber makes similar use of the home-network. Accordingly, when the subscriber is first positioned whereat use of the visitor-network is mandated, but travels to a geographic area also encompassed by the home-network, the subscriber has an interest in early termination of utilization of the visitor-network and early commencement of utilization of the home-network.

A means by which early detection may be made of times in which the home-network is accessible by the subscriber when the subscriber is initially in the visitor-network would therefore be advantageous.

In some other instances, the subscriber may be positioned in an area encompassed by a cellular communication network other than the home-network, but in which the operator of the home-network has no agreement with the corresponding communication system permitting utilization of the communication system by subscribers of the home-network. If the communication systems are otherwise compatible, the subscriber of the home-network is oftentimes able to access the corresponding communication system for emergency purposes (such as to dial the emergency number 1-1-2 in Europe or 9-1-1 in the United States of America), but is unable otherwise to utilize the corresponding communication network. When the subscriber is initially positioned in the corresponding communication network, and then travels into a geographic area also encompassed by the home-network, the subscriber has an interest in early detection of the accessibility of the home-network. (Additionally, when the subscriber is initially positioned in the corresponding communication network, and then travels into a visitor-network which permits normal utilization of the visitor-network, the subscriber may also have an interest in early detection of the accessibility of the visitor-network permitting such normal utilization.)

A means by which early detection may be made of times in which the home-network is accessible by the subscriber when the subscriber is initially positioned in such a visitor-network, would therefore also be advantageous. (Additionally, a means by which early detection may be made of times in which a visitor-network permitting normal utilization is accessible by the subscriber when the subscriber is initially positioned in a visitor-network permitting only emergency utilization would also be advantageous.)

The cellular network which a subscriber desires to utilize when possible, typically the home-network, shall at times hereinafter be referred to as a "most-desired network" and other networks, typically visitor-networks, shall be referred to as less-than-most desired networks at times hereinbelow. (For instance, a subscriber may initially be positioned in a visitor-network permitting of only emergency communication but may later be repositioned in a visitor-network permitting normal communications. In such an example, the visitor-network permitting normal communications comprises the most-desired network and the visitor-network permitting of only emergency communications comprises the less-than-most desired network.)

Many radiotelephones are constructed to be operated by battery power supplies and are operative for only a limited period of time due to the finite energy storage capacity of the battery power supplies. Searching by the radiotelephone of the control channels for control signals transmitted by transmitters of any particular cellular communication network upon the control channels requires powering of the radiotelephone not only to detect the presence of the control signals transmitted upon the control channels, but also to determine the information content of any detected, control signals. (Determination of the information content of the detected signal is required in order to determine the base station from which the signal is transmitted.)

If the radiotelephone is positioned at a location having no cellular coverage, or having cellular coverage of an incompatible cellular communication system, continued searching by the radiotelephone of the control channels results in depletion of the stored energy of the battery power supply which powers the radiotelephone. Such continued searching, therefore, can result in sever limitation in the operational period of the radiotelephone to communicate therethrough, as an excessive amount of stored energy is depleted searching the control channels.

Because of the limited energy storage capacity of battery power supplies which power many radiotelephones, mechanisms to detect when the subscriber may access a most-desired network must not require significant amounts of power to be consumed to make such detection.

What is needed, therefore, is a mechanism for limiting continual searching by a radiotelephone of control channels when a communication link cannot be established with a base station for a first embodiment.

What is also needed, therefore, is a mechanism for permitting early detection of times that the radiotelephone, although initially positioned in a geographic area encompassed by a cellular network other than a most-desired network, becomes repositioned within the geographic area encompassed by the most-desired network, but which requires only minimal amounts of power to make such early detection for a second embodiment.

SUMMARY OF THE INVENTION

The present invention, accordingly, advantageously provides a method, and associated circuitry, for overcoming the limitations of the existing art.

The present invention further advantageously provides means for limiting continual searching by a radiotelephone of control channels when a communication link cannot be established with a base station.

The present invention includes further advantages and features, the details of which will become more apparent by reading the detailed description of the preferred embodiments hereinbelow.

In accordance with a first embodiment of the present invention, a method, and associated circuit for implementing such, for selecting tuning of tuning circuitry of a radio receiver to a frequency channel of a set of frequency channels defined upon a frequency band is disclosed. Each frequency channel of the set of frequency channels is suitable for transmission thereupon of a communication signal transmitted by a transmitter of a group of remotely-positioned transmitters. The tuning circuitry of the radio receiver is tuned to each frequency channel of the set of frequency channels defined upon the frequency band. Power levels of communication signals transmitted upon individual ones of the frequency channels of the set of frequency channels are measured. Frequency channels upon which communications signals of measured power levels beyond a predetermined minimum power level are selected to form a first subset of frequency channels. A determination is made whether a communication link may be effectuated between the radio receiver and individual ones of the transmitter which transmits communication signals upon the frequency channels of the first subset of frequency channels. Tuning of the tuning circuitry of the radio receiver to a frequency channel upon which a communication signal is transmitted by a transmitter to which a communication link with the radio receiver may be effectuated is selected when such communication link is possible.

In accordance with a second embodiment of the present invention, therefore, a method, and associated circuit, for retuning a tuning frequency of tuning circuitry of a radio receiver to receive a communication signal transmitted upon a frequency channel of a set of frequency channels defined upon a frequency band by a transmitter of a most-desired network of transmitters is disclosed. The radio receiver is initially tuned to receive a communication signal transmitted by a transmitter of a less-than-most desired network of transmitters. The tuning circuitry of the radio receiver is tuned to each frequency channel of the set of frequency channels defined upon the frequency band. Power levels of communication signals transmitted upon individual ones of the frequency channels of the set of frequency channels are measured. Frequency channels upon which communication signals are transmitted of measured power levels beyond a minimum power level are selected to form a first subset of frequency channels. A determination is made as to whether a communication signal transmitted upon a frequency channel of the first subset of frequency channels is transmitted by a transmitter of the most-desired network of transmitters. If a determination is made that the communication signal is transmitted by the transmitter of the most-desired network of transmitters, then tuning of the frequency of the tuning circuitry of the radio receiver is selected to the frequency channel upon which the communication signal is transmitted by the transmitter of the most-desired network of transmitters.

BRIEF DESCRIPTION OF THE DRAWINGS

The present invention will be better understood when read in light of the accompanying drawings in which:

FIG. 1 is a partial schematic, partial block diagram of cellular communication networks in which the method and circuit of the preferred embodiment of the present invention is operative;

FIG. 2-1 is a schematic representation of a portion of a frequency band allocated for cellular communications;

FIG. 2-2 is a schematic representation of a single frequency channel illustrating time slots defined thereupon as utilized in a time-division multiplexing technique;

FIG. 4-1 is a representation of the relationship between the power levels of control signals measured during operation of the preferred embodiment of the present invention and a dynamically-established noise floor derived therefrom;

FIG. 4-2 is a representation of the relationship between the power levels of control signals measured during operation of the preferred embodiment of the present invention and an absolute-valued noise floor;

DESCRIPTION OF THE PREFERRED EMBODIMENTS

Figures 1, 2:
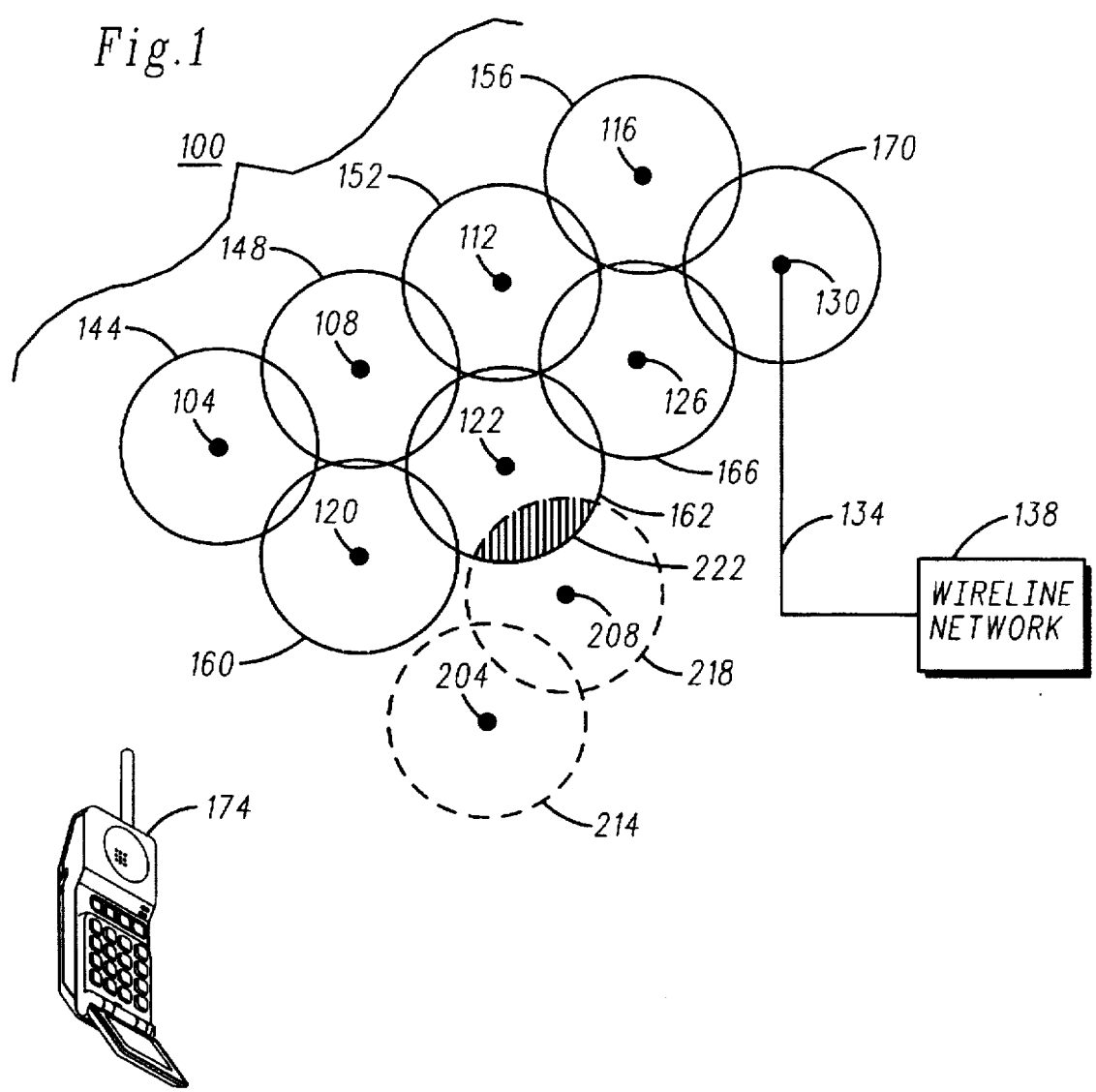

Referring first to the schematic illustration of FIG. 1, a cellular communication network, referred to generally by reference numeral 100, is shown. As mentioned hereinabove, a cellular communication network is formed by positioning numerous base stations at spaced-apart locations throughout a geographical area. Such base stations are indicated in FIG. 1 by points 104, 108, 112, 116, 120, 122, 126, and 130. While eight base stations are illustrated in the figure, it is to be understood, of course, that a typical cellular communication network is conventionally comprised of significantly greater numbers of base stations.

Each base station 104-130 contains circuitry permitting transmission of communication signals transmitted by the base station to a plurality of radiotelephones when such radiotelephones are positioned at locations within the vicinity of respective ones of the base stations, and to receive communication signals transmitted by such plurality of radiotelephones.

Each base station 104-130 is coupled to a conventional, wireline, telephonic network. Such connection is represented in the figure by line 134 interconnecting base station 130 and wireline network 138. Connections between wireline network 138 and other ones of the base stations 104-126 may be similarly shown.

The positioning of each of the base stations 104-130 forming cellular communication network 100 is carefully selected to ensure that at least one base station is positioned to receive a communication signal transmitted by a radiotelephone positioned at any location throughout the geographical area encompassed by system 100, thereby defining the cellular coverage area of the system. That is to say, at least one base station 104-130 must be within the transmission range of a radiotelephone positioned at any such location throughout the geographical area. (Because the maximum signal strength, and hence, maximum transmission range, of a signal transmitted by a base station is typically greater than the maximum signal strength, and corresponding maximum transmission range, of a signal generated by a radiotelephone, the maximum transmission range of a signal generated by a radiotelephone is a primary factor which must be considered when positioning the base stations of the cellular communication network.)

Because of the spaced-apart nature of the positioning of the base stations, portions of the geographical area throughout which base stations 104-130 are located are associated with individual ones of the base stations. Portions of the geographical area proximate to each of the spaced-apart base stations 104-130 define "cells" which are represented in the figure by areas 144, 148, 152, 156, 160, 162, 166, and 170. Cells 144-170 together form the geographical area and define the coverage area encompassed by cellular communication system 100. A radiotelephone positioned within the boundaries of any of the cells 144-170 of system 100 may transmit, and receive, modulated signals to, and from, at least one base station 104-130.

Communication system 100 is representative of a conventional, cellular communication system or a cellular communication system of increased capacity.

As mentioned previously, a subscriber of a cellular network usually enters into a billing arrangement with the operator of one cellular communication network, and such network is referred to by the subscriber by the term "home-network." For purposes of the following description, cellular communication network 100 shall hereinafter be referred to as the home-network or, more generally, the most-desired network. (It should, however, again be noted that, while the home-network is typically the most-desired network, in some instances, a visitor-network comprises the most-desired network.)

As also mentioned previously, the general protocol by which communication between a radiotelephone and a base station of a cellular communication network is initiated involves detection by a radiotelephone of control signals transmitted by various ones of the base stations on various ones of the control channels defined in the communication network. Each base station of the cellular communication network transmits control signals on predefined control channels to identify the presence of such base station, and thereby to effectuate a communication down-link with a radiotelephone once the radiotelephone ascertains the information content of the control signal transmitted upon a selected control channel. (Again, when time-division multiplexing techniques are utilized, control and traffic channels may be defined at similar frequencies, but in dissimilar time slots.)

Once a communication down-link has been effectuated between the radiotelephone and a base station, portions of the receiver circuitry of the radiotelephone may be powered-down, to be re-powered thereafter in a desired duty cycle to ascertain, during resultant periodic intervals, the information content of the control signal transmitted upon the control channel.

When a call is made to the radiotelephone, the information content (i.e., the data) of the control signal instructs the radiotelephone to be tuned to particular traffic channels defined upon the cellular communication system to permit two-way communication between the radiotelephone and the base station. Otherwise, portions of the receiver circuitry of the radiotelephone are powered-down according to the desired duty cycle.

However, when the radiotelephone is positioned beyond the coverage area of a cellular communication system, a search of the control channels of the communication system does not result in the detection of a signal permitting effectuation of a communication link. For instance, a radiotelephone, indicated in the figure by radiotelephone 174, is positioned beyond the cellular coverage area of cellular communication system 100. A search of the control channels by the radiotelephone when positioned beyond the cellular coverage area does not result in effectuation of a communication link with any of the signals transmitted by any of the base stations 104–130 of system 100. Repeated searching of each of the control channels of the communication system, to detect the presence of a signal transmitted thereupon, and the information content of any such detected signal, is both time-consuming and energy-consumptive. As a radiotelephone is, in many instances, powered by a battery power supply, energy consumption of the radiotelephone is desired to be limited to maximize the period of operability of the radiotelephone with such battery power supply.

As also mentioned previously, different, cellular communication networks are oftentimes configured over various contiguous, geographic areas. And to a user, the geographic areas encompassed by the contiguously-positioned networks appear to overlap somewhat. A portion of a second, cellular communication network, here referred to generally by reference numeral 200, is also shown in FIG. 1. Network 200 is configured to be contiguous with network 100. Analogous to points 104–130 which represent base stations of network 100, points 204 and 208 represent base stations of network 200. And, analogous to areas 144–170 which represent cells of network 100, areas 214 and 218, shown in hatch, represent cells of network 200. For purposes of the following description, network 200 shall be referred to as the visitor-network or, more generally, the less-than-most desired network.

As also mentioned previously, a subscriber to a home-network is also oftentimes permitted to utilize the visitor-network when the subscriber is located in the geographic area encompassed by the visitor-network. Or, in other instances, the subscriber is permitted to utilize the visitor-network when located in the geographic area encompassed by the visitor-network for emergency purposes. However, in the former instance, the fees required of the subscriber to utilize the visitor-network are greater than corresponding fees required to utilize the home-network. And, in the latter instance, the subscriber is not permitted to utilize the visitor-network but for the emergency purposes.

Accordingly, therefore, when a subscriber is initially positioned away from a most-desired network, such as network 100 of FIG. 1, and located in the geographic area encompassed by a less-than-most desired network, such as network 200 of FIG. 1, and the subscriber utilizes the less-than-most desired network, but then travels into a geographic area encompassed by the most-desired network, the subscriber has an interest in early termination of utilization of the less-than-most desired network and early commencement of utilization of the most-desired network.

When a radiotelephone utilized by a subscriber is positioned beyond the coverage area of most-desired network 100, but is positioned within the coverage area of a less-than-most-desired network 200, a search of the control channels conducted by the circuitry of the radiotelephone results in detection of signals transmitted by base stations of the less-than-most-desired network, and communication by the radiotelephone with the less-than-most-desired network is permitted in the manners noted hereinabove.

Repositioning of the radiotelephone, though, may position the radiotelephone within the geographic area encompassed by the most-desired network.

Additionally, when the radiotelephone is initially positioned beyond the cellular coverage area of the communication system in which the radiotelephone is operative, (here, for purposes of illustration, cellular communication system 100), but is subsequently relocated to be within the coverage area of the cellular communication system, the radiotelephone must be able to detect the presence of control signals transmitted upon the control channels of the communication system once positioned within the coverage area thereof. However, again, such continual searching of the control channels of the communication system to detect the presence of control signals thereupon can be quite energy-consumptive.

Shaded area 222 represents geographic overlapping of the coverage areas of most-desired network 100 and less-than-most-desired network 200. A subscriber to most-desired network 100 may initially position a radiotelephone within the coverage area of only less-than-most-desired network 200 (exclusive of overlapping area 222). While the subscriber may utilize the radiotelephone to communicate with network 200 in the manners noted hereinabove, the subscriber may reposition the radiotelephone within a geographic area encompassed by both most-desired network 100 less-than-most-desired network 200, here shaded area 222. Because the subscriber has an interest in utilizing a most-desired network rather than a less-than-most-desired network, when the subscriber initially positions a radiotelephone in a geographic area permitting utilization of only a less-than-most-desired network but then travels into a geographic area permitting utilization of the most-desired network, a means permitting the radiotelephone to make early detection of the accessibility to the most-desired network would be advantageous. But, such means must not require significant amounts of power to be consumed to make such detection.

FIG. 2-1 is a schematic representation of a frequency band, referred to generally by reference numeral 300, allocated for cellular communications. Frequency band 300 is divided into numerous frequency channels, some of which are designated to be control channels, here designated by $D_1$, $D_2$, ... $D_n$, and traffic channels $V_1$, $V_2$, $V_3$, ... $V_n$. Upon powering-on of a radiotelephone, the general protocol of operation of initiation of establishment of a communication link with a base station, the radiotelephone searches each of the control channels defined upon frequency band 300.

FIG. 2—2 is a schematic representation of a single frequency channel, here designated by reference numeral 306, and the time slots defined thereupon over a period of time. Frequency channel 306 represents time slots defined upon a single frequency channel when time-division multiplexing techniques are utilized. Frequency channel 306 defines a plurality of time slots thereupon. Using the designations of FIG. 2-1, time slots $V_1$ through $V_n$ are defined to be traffic channels, and other time slots $D_1$ through $D_n$ are defined to be control channels.

FIGS. 2-1 and 2—2 utilize similar designations, as the method and circuit of the preferred embodiments of the present invention are operable to search control channels defined either conventionally or in a time-division multiplexed system.

Tuning circuitry of the receiver portion of such radiotelephone tunes the radiotelephone to each of the control channels $D_1$, $D_2$, ... $D_n$ to detect the presence of control signals transmitted upon any of the control channels. The power levels of any detected control signals on any of the control channels are measured, and a communication link is attempted to be effectuated with the transmitter which transmits the detected signal of greatest power level (by ascertaining the information content of such detected signal in a first embodiment).

A communication down-link may be effectuated with such transmitter when the information content of the control signal is ascertainable by the radiotelephone. That is to say, when an attempt is made to establish a communication down-link with a base station of an incompatible cellular communication system, the information content of such control signal cannot be ascertained by the radiotelephone. Such data signal should be ignored by the radiotelephone in subsequent searches of the control channel when attempting to effectuate a communication link with one of the base stations of a cellular communication system in the first embodiment.

It is noted that the power levels of signals detected by receiver circuitry may be quickly and efficiently (i.e., with little energy consumption) determined, whereas determination of the information content of an encoded signal detected by the receiver typically requires operation of signal processing circuitry. Such circuitry requires relatively significant amounts of energy for operation. The present invention advantageously minimizes the times in which such processing circuitry must be operated.

The power levels of any detected control signals on any of the control channels are measured, and a communication link is attempted to be effectuated with the base station of the most-desired network which transmits the detected signal of greatest power level in a second embodiment. (A determination that the base station which transmits the control signal is of the most-desired network is made by ascertaining the information content of such detected signal.)

If a communication link may not be effectuated between the radiotelephone and a base station of a most-desired network, a communication link is instead effectuated (if possible) with a base station of a less-than-most-desired network in the second embodiment.

Figure 3:
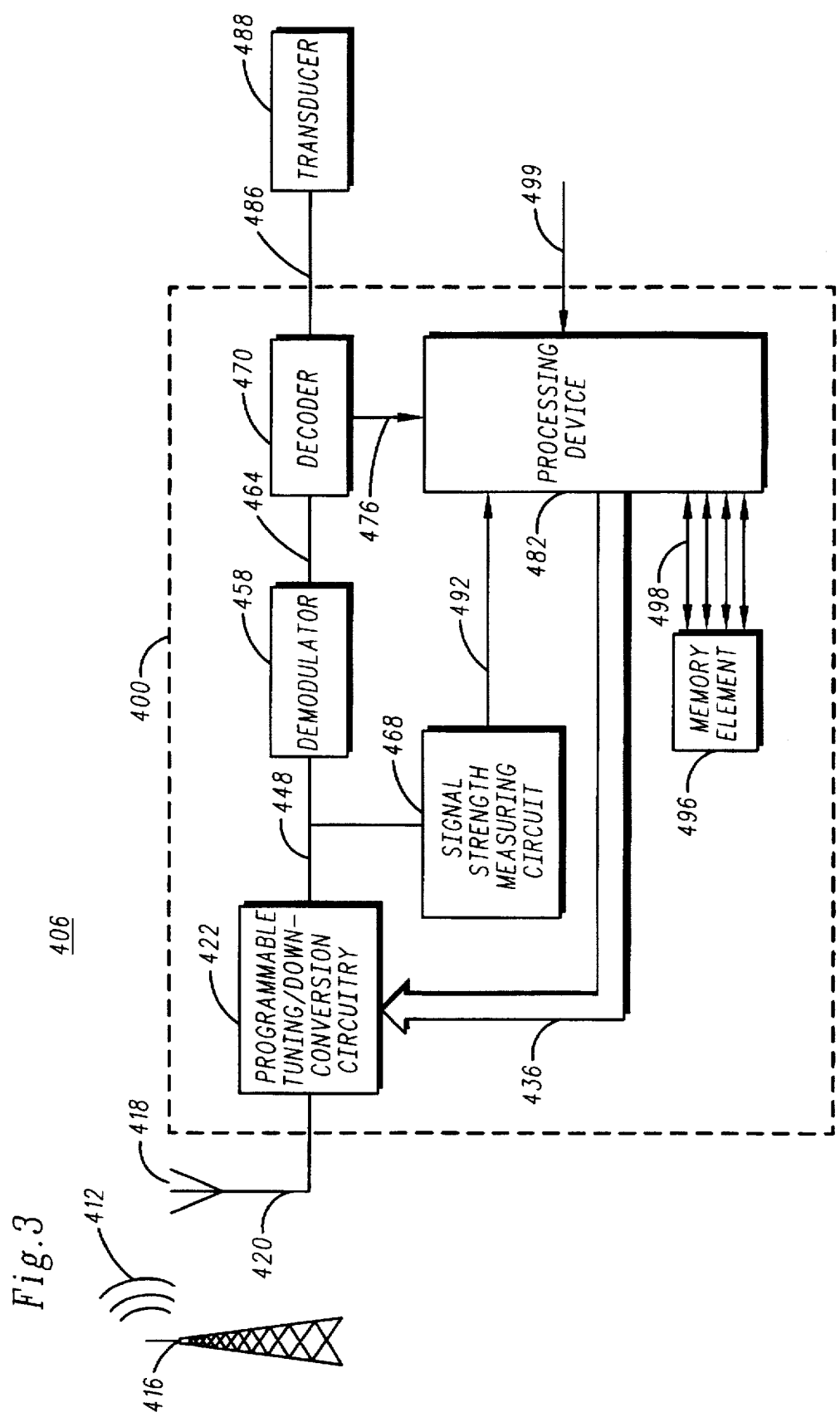
FIG. 3 is a logical block diagram of a radio receiver including the circuit of the preferred embodiment of the present invention.

Turning next to the logical block diagram of FIG. 3, a circuit, referred to generally by reference numeral 400 comprised of the elements encompassed by the block shown in hatch, of the preferred embodiment of the present invention is shown. Circuit 400, as illustrated in FIG. 3, forms a portion of a radio receiver, referred to generally by reference numeral 406. Radio receiver 406 may, for example, comprise the receiver circuitry portion of a radio transceiver, such as a radiotelephone, operative in a cellular communication system.

Radio receiver 406 is operative to search predefined control channels, such as control channels $D_1$–$D_n$ shown in FIG. 2-1 or FIG. 2—2 to detect the presence of control signals transmitted upon individual ones of the control channels.

Control channels, of which lines 412 are indicative, transmitted by transmitters, such as transmitter 416, are detected by antenna 418 of receiver 406. Signals representative of the signals detected by antenna 418 are generated on line 420 and supplied to programmable tuning/down-conversion circuitry 422. Circuitry 422 tunes the receiver to certain frequency channels, here initially the control channels, responsive to signals supplied thereto on lines 436.

Circuitry 422 generates signals on line 448 representative of the control signals within particular ones of the frequency channels to which circuitry 422 tunes the receiver 406. The signals generated on line 448 are supplied to demodulator 458 and signal strength measuring circuitry 468. Demodulator 458 generates a demodulated signal on line 464 which is supplied to decoder 470. Decoder 470 generates signals on line 476 which are applied to processing device 482. Decoder 470 is further operative to generate a decoded signal on line 486 which is coupled to transducer 488, such as a speaker.

Signal strength measuring circuitry 468 generates a signal on line 492 which is coupled to an input of processing device 482 to supply thereby processing device 482 with information relating to the power level of the signal generated on line 448. As the signal generated on line 448 is indicative of a signal detected by antenna 418, the level of the signal generated on line 492 is similarly indicative of the power level of the signal detected by antenna 418.

Memory element 496 is further illustrated in the figure connected to processing device 482 by lines 498.

In operation according to the first embodiment, radio receiver 406 first searches each channel of a predetermined set of the control channels defined upon a communication system to detect the presence of control signals transmitted thereupon.

In operation according to the second embodiment, if radio receiver 406 is unable to effectuate a communication link with a base station of a most-desired network, a communication link is instead effectuated, if possible and if desired by the user, with a base station of a less-than-most-desired network. However, even though a communication link is effectuated with the less-than-most-desired network, radio receiver 406 is thereafter operative to search each channel of a predetermined set of control channels to attempt to detect the presence of control signals transmitted thereupon by base stations of the most-desired network.

Processing device 482 generates signals on line 436 to cause tuning of circuitry 422 to each of the control channels in sequence. When the receiver 406 is tuned to each of the control channels, signals indicative of the detected signal on the respective ones of the control channels are generated by circuitry 422 on line 448. Signal strength measuring circuitry 468 measures the amplitudes of the signals generated on line 448 and generates signals on line 492 indicative of such power levels. Processing device 482 stores such measured values in memory element 496. Processing device 482 is operative to correlate the measured power levels and the frequency channels on which such signals are transmitted.

Once the power levels of the data signals transmitted upon the various control channels have been measured, processing device 482 is operative to determine whether an attempt should be made to establish a communication downlink with a base station which transmits a control signal upon one of the control channels.

In order to make such determination, processor 482 forms a first subset of control channels of the set of control channels. The control channels of which the first subset is comprised are selected responsive to the power levels of the control signals transmitted thereupon.

In the preferred embodiment, only control channels upon which data signals having power levels beyond either: 1.) a dynamically-established "noise floor" level; or 2.) an absolute-valued noise floor are selected to form the channels of the first subset of control channels.

The dynamically-established noise floor is established by comparing the power levels of each of the control signals measured by signal strength measuring circuitry 468. The noise floor is established at a power level at a certain value above a measured power level of lowest magnitude.

Line 499 is further illustrated in the figure providing a line for an external input to processing device 482 to reset operation of receiver 406 at any time. Such a signal may be generated, for example, by actuation of an actuation switch connected to line 499.

Figures 1, 4:
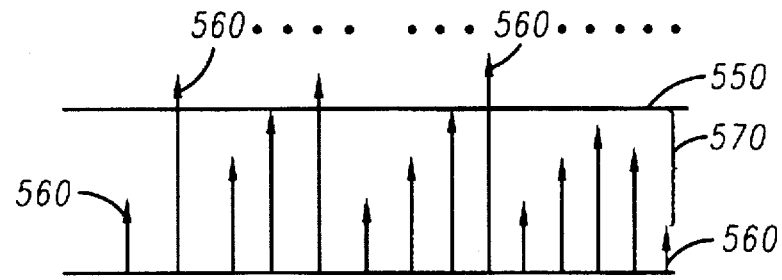
Figures 2, 4:
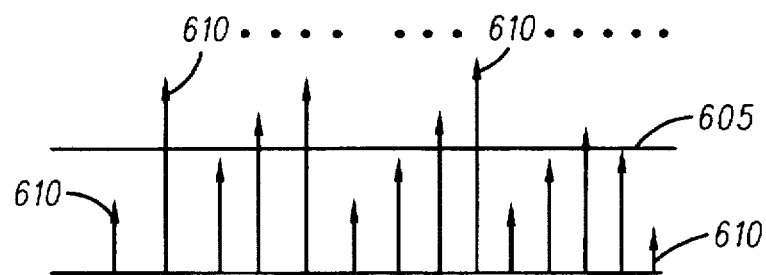

FIG. 4-1 is a representation of the dynamically-established noise floor, designated in the figure by line 550. Each arrow 560 designates a signal detected upon a control channel by receiver 406 of FIG. 3. The height of each arrow 560 is indicative of the power level thereof. Line 550 designating the dynamically-established noise floor is established at a certain power level, indicated by bracket 570, above the power level of the signal of the lowest power level, such signal being represented by the arrow 560 positioned at the right-most side of the figure. Frequency channels upon which data signals of power levels greater than this noise floor are selected to form the first subset of control channels. As the value of the dynamically-established, noise floor is dependent upon the measured power level values, the value of such noise floor so established is variable, depending upon the actual, measured power levels of the control signals.

The absolute-valued noise floor is a power level of a selected magnitude. FIG. 4-2 is a representation of the absolute-valued, noise floor, designated in the figure by line 605. Each arrow 610 designates a signal detected upon a control channel. The signals represented by arrows 610 correspond to signals represented by arrows 560 of FIG. 4-1, and the heights of each arrow are indicative of the power level thereof. Frequency channels upon which control signals of power levels greater than this noise floor are also selected to form the first subset of control channels.

Hence, preferably control channels are selected to form the first subset of control channels if a control signal transmitted thereupon isgreater than either the dynamically-established noise floor or the absolute-valued noise floor.

An attempt to effectuate a communication link with a base station which transmits a control signal to receiver 406 is made only with base stations which transmit signals upon control channels of the first subset of control channels.

According to the first embodiment, a communication link is effectuated only when decoder 470 indicates the presence of valid information of the control signal once demodulated by demodulator 458, and supplied thereto on line 464. (That is, decoder 470 generates signals on line 476 when the information-content of the control signal transmitted upon the selected control channel may be ascertained.) The signal generated by decoder 470 on line 476 and supplied to an input of processing device 482 indicates proper decoding of the information content of such a control signal, and, hence, an indication that a communication link may be effectuated with the transmitter which transmits such a control signal.

If a communication link may not be effectuated with any of the transmitters which transmit the control signals upon the frequency channels of such first subset of frequency channels, according to the first embodiment, the radio receiver pauses for a certain time period prior to again commencing to attempt to establish a communication link with a transmitter. During such time period, portions of the circuitry of the receiver may be powered-down to limit energy usage of the receiver 406 during such period. (For instance, decoder 470, typically comprised of a digital signal processor, may be powered-down during such time period.)

Hence, according to the second embodiment, effectuation of a communication link occurs only when decoder 470 determines that the signal transmitted upon one of the frequency channels is transmitted by a base station of the most-desired network. (That is, decoder 470 generates signals on line 476 when the information-content of the control signal transmitted upon the selected control channel indicates that the control signal is transmitted by a base station of the most-desired network.) The signal generated by decoder 470 on line 476 and supplied to an input of processing device 482 indicates proper decoding of the information content of such a control signal, and, hence, an indication that the radio receiver may be retuned to effectuate a communication link with the base station of the most-desired network which transmits such a control signal.

If control signals generated by base stations of the most-desired network of sufficient power levels are not detected, and the radio receiver is not retuned to attempt to effectuate a communication link with a base station of the most-desired network, according to the second embodiment, the radio receiver pauses for a certain time period prior to again commencing to attempt to establish a communication link with a base station of the most-desired network.

Preferably, the time period during which the radio receiver pauses is given by the equation:

$$TP = (x + (y * \text{the number of frequency channels of the first subset})) * z\%$$

where:

TP is the time period (in seconds);

x is the time period required to measure the power levels of the data signals transmitted upon any of the control channels;

y is the time required, once a decision has been made to attempt to establish a communication link with one of the base stations, of circuitry 422 to tune receiver 406 to a particular control channel; and z is a desired duty cycle of the radio receiver.

The time period in the first embodiment is preferably the lesser of a fixed amount of time (e.g., about 15 seconds) or the above time period.

After the time period determined by the above equation elapses, circuitry 422 is again operative to tune the receiver to each of the control channels of the frequency band. The power levels of each of the signals transmitted upon each of the respective ones of the control channels are again measured (i.e., remeasured) by circuit 468, and signals indicative of such measured power levels are supplied on line 492 to processing device 482. Processing device 482 is operative to compare the re-measured power levels of the control signals transmitted upon the respective ones of the control channels, and to compare such re-measured power levels with corresponding, previously-measured power levels of the signal transmitted upon the frequency channels of the first subset of frequency channels.

Processing device 482 is operative to form a second subset of control channels. Only control channels upon which data signals having power levels which: 1) were previously less than the dynamically-established noise floor and which, upon re-measurement, are above such dynamically-established noise floor; 2) were previously less than the absolute-valued noise floor, and which, upon re-measurement, are above such absolute-valued noise floor; or 3) exhibit a significant rise in power level (for instance, an increase in power level of 6 decibels) are selected to form the channels of the second subset of control channels. And, the radio receiver is operative to attempt to effectuate a communication link only with base stations which transmit signals upon frequency channels of this second subset. Decoder 470 is again operative to generate signals on line 476 to indicate whether a communication link may be effectuated according to the first embodiment or the control signals are transmitted by base stations of the most-desired network according to the second embodiment.

(It is noted that other methods of selecting the second subset of frequency channels may also be utilized. For instance, in substitution for steps 1 and 2 above, control channels upon which data signals having power levels which were previously less than both the dynamically-established noise floor and the absolute-valued noise floor, and which, upon re-measurement are above either one of the noise floors may be utilized to form the second subset of control channels.)

More particularly, processing device 482 is operative to determine upon which frequency channels are signals which were previously below either of the noise floors—i.e., below either the dynamically-established noise floor or the absolute-valued noise floor—and which as re-measured, are above the respective one of the noise floors, or are of a significantly increased magnitude.

Line 499 is further illustrated in the figure providing a line for an external input to processing device 482 to reset operation of receiver 406 at any time. Such a signal may be generated, for example, by actuation of an actuation switch connected to line 499.

Figure 5:
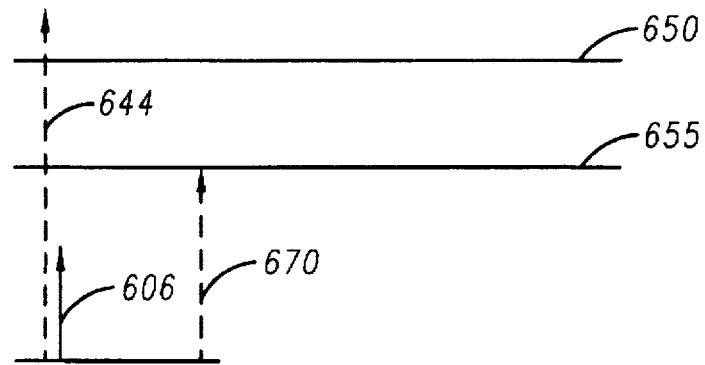
FIG. 5 is a representation illustrating the relationship between the power level of a previously-measured signal and the power level of such signal upon re-measurement thereof; a comparison of such power levels is utilized during operation of the preferred embodiment of the present invention.

FIG. 5 is a representation of operation of processing device 482 to determine which frequency channels to select to form the second subset of frequency channels. Again, attempts are made to effectuate a communication link with only those transmitters which transmit signals upon control channels of such second subset.

Horizontal line 650 represents the dynamically-established noise floor, and horizontal line 655 represents the absolute-valued noise floor. (It is noted that the relative values of the noise floors could also be reversed, viz., the absolute-valued noise floor may be of a value greater than the dynamically-established noise floor.) Arrow 606 represents a signal transmitted upon a frequency channel having an initially-measured power level beneath that of noise floors 650 and 655. (It is noted that noise floors 650 and 655 correspond to noise floors 550 and 605 of FIGS. 4-1 and 4-2, respectively.) The frequency channel upon which signal 606 is transmitted does not form a portion of the first subset of frequency channels as the power level of signal 606, upon initial measurement, was beneath the noise floors.

However, after the receiver pauses for the time period determined by the above-noted equation, and the power levels of the signals transmitted on the various ones of the control channels are re-measured, the signal generated on the same control channel, and here indicated by arrow 644, shown in hatch, is above at least one of the noise floors. Such control channel is selected to form a control channel of the second subset of frequency channels and the radio receiver is operative to attempt to effectuate a communication link with a base station which transmits a control signal upon a selected control channel of the second subset of control channels. A control channel having a control signal transmitted thereupon by a base station of significantly increased power levels (irrespective of whether the re-measured value exceeds a noise floor) is also selected to form the second subset of control channels. Such a signal is indicated in FIG. 5 by arrow 670, shown in hatch.

According to the second embodiment, after the power levels of the signals transmitted upon the respective ones of the control channels are re-measured and no signal of adequate power level transmitted by a base station of the home-network is detected, if the radio receiver 406 again pauses for a time period, and the circuitry of the receiver powers-down once again. In a preferred embodiment, the predetermined time period is a time period corresponding to the greater of a fixed time period, or the previously-noted equation.

If, after the power levels of the data signals transmitted upon the respective ones of the control channels are re-measured, no communication down-link in either the first or second embodiment can be effectuated, the radio receiver 406 again pauses for a time period, and the circuitry of the receiver powers-down once again. In a preferred embodiment, the predetermined time period is a time period corresponding to the greater of a fixed time period, or the previously-noted equation.

That is, the time period during which portions of the receiver power down is the greater of a fixed amount of time (e.g., fifteen seconds) and the time period given by the equation:

$$TP = (x + (y * \text{the number of frequency channels of the first subset})) * z\%$$

where:

TP is the time period (in seconds);

x is the time period required to measure the power levels of the data signals transmitted upon any of the control channels;

y is the time required, once a decision has been made to attempt to establish a communication link with one of the base stations, of circuitry 422 to tune receiver 406 to a particular control channel; and z is a desired duty cycle of the radio receiver.

With reference again to FIG. 1, according to the first embodiment, when the radiotelephone is located beyond the area of cellular coverage of cellular communication system 100, signals transmitted by various ones of the base stations upon the control channels are beneath the noise floors. A radiotelephone incorporating circuitry similar to radio receiver 406 will not attempt to establish a communication down-link with any of the base stations transmitting any of such signals on any of the frequency channels. However, when the radiotelephone is repositioned to be located within the cellular coverage area of cellular communication system 100, and the power levels of the data signals transmitted on the various ones of the control channels by the base stations are re-measured, at least one of the control signals will now be of a power level in excess of the noise floors or will be of a significantly increased power level. Control channels upon which such data signals are transmitted are selected to form the control channels of the second subset of frequency channels, and an attempt is made to effectuate a communication link with the base station which transmits such signal upon one of such control channels. As the radio receiver circuitry powers-down for a predetermined time period after a determination is made that a communication link cannot be established with any of the transmitters which transmit control signals upon various ones of the control channels, energy usage of the radio is minimized.

Such a process of selecting control channels to form the second subset of control channels in the first embodiment is repeated, communication down-links are attempted to be effectuated, and powering-down of the receiver circuitry occurs if no down-link can be effectuated continues. After a selected time period, such as ten minutes, if a communication down-link cannot be effectuated, the system is reinitialized to determine again a first subset of control channels.

With reference again to FIG. 1, according to the second embodiment, when a subscriber of home-network 100 positions a radiotelephone beyond the coverage area of most-desired network 100, signals transmitted by various ones of the base stations of most-desired network 100 are beneath the noise floors if such signals are detected by the receiver circuitry of the radiotelephone. However, if the subscriber positions the radiotelephone within the geographic area encompassed by less-than-most-desired network 200, a communication link may be effectuated with a base station of the less-than-most-desired network.

A radiotelephone incorporating circuitry similar to radio receiver 406 will, at intermittent intervals, again measure the power levels of signals transmitted upon the control channels of the frequency band allocated for cellular communications. If control signals transmitted upon any of the control channels are of power levels in excess of the above-defined noise floors, and are transmitted by base stations of the most-desired network, the radio receiver will be retuned to the control channel upon which such a control signal is transmitted.

Control channels upon which such signals are transmitted are selected to form the control channels of the second subset of frequency channels, and if a signal transmitted upon a control channel of the second subset of frequency channels is transmitted by a base station of the most-desired network, a communication link is effectuated with such base station. If a determination is made that no control signal generated upon a control channel of the second subset of frequency channels is transmitted by a base station of the most-desired network, the radio receiver circuitry powers-down for a predetermined time period to minimize energy usage of the radio.

Such a process of selecting control channels to form the second subset of control channels is repeated intermittently to determine whether a control signal transmitted upon a control channel is transmitted by a base station of a most-desired network. After a selected time period, such as ten minutes, if a communication link is not effectuated with a base station of the most-desired network, the system is re-initialized to determine again a first subset of control channels.

Figure 6:
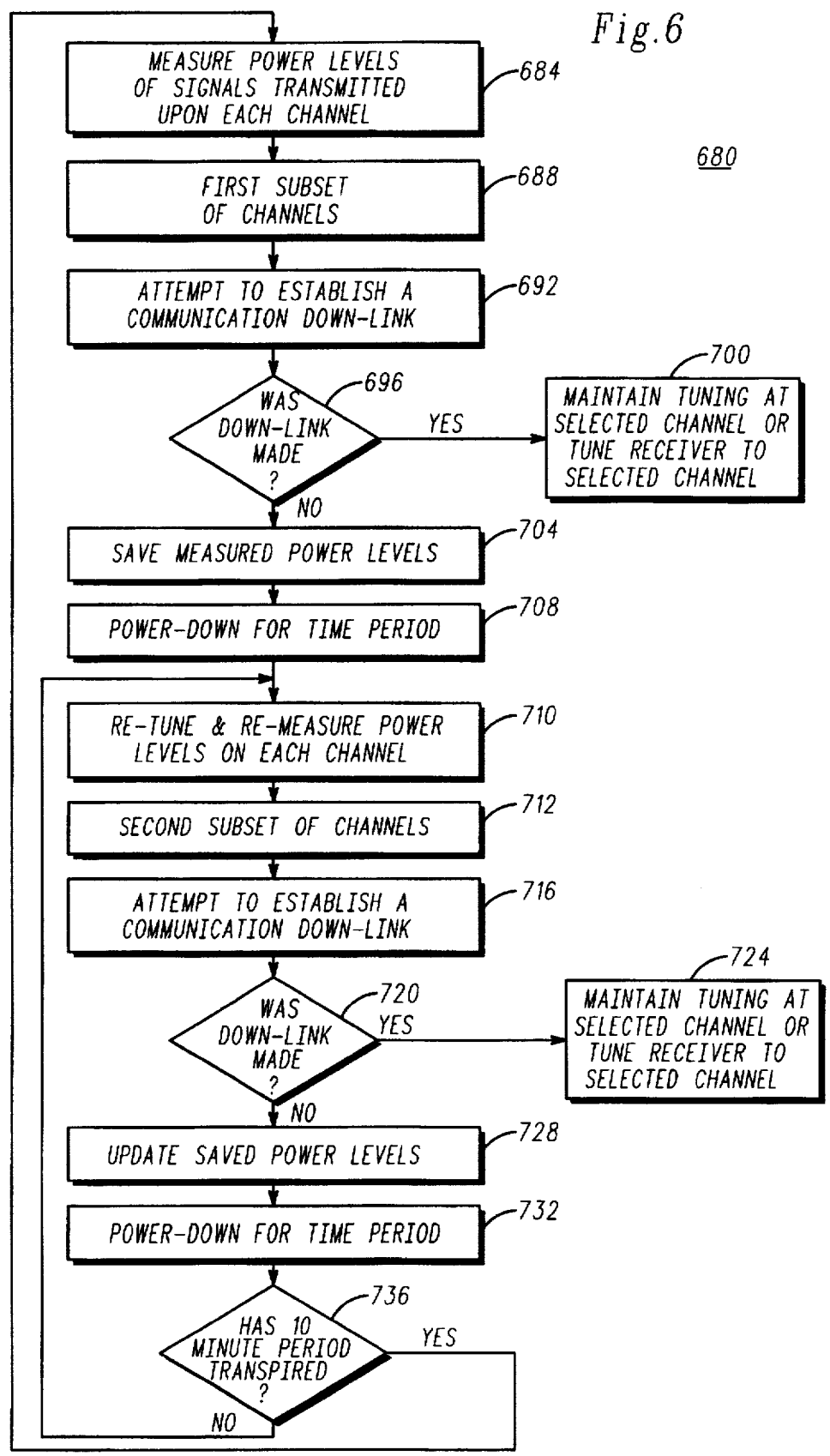
FIG. 6 is a logical flow diagram of an algorithm embodying the method of the preferred embodiment of the present invention.

Turning next to the logical flow diagram of FIG. 6, an algorithm, referred to generally by reference numeral 680, incorporating the method of the preferred embodiment of the present invention is shown. The algorithm may, for example, be executable by processing device 482 of receiver 406 of FIG. 3. For purposes of example, the tuning circuitry of a receiver operative with such an algorithm shall be assumed to be tuned, prior to (and during) execution of the algorithm, to receive signals generated by a base station of a less-than-most-desired network.

First, and as indicated by block 684, the power levels of signals transmitted upon each of the control channels is measured. The first subset of control channels is formed, as indicated by block 688, and an attempt is made to establish a communication down-link with a base station of a most-desired network which transmits a control signal upon one of such channels, as indicated by block 692.

At decision block 696, a determination is made whether a communication down-link may be effectuated with a base-station of the most-desired network. If a down-link may be effectuated, the yes branch is taken to block 700, and the tuning frequency of the receiver tuning circuitry is tuned to the frequency of the selected control channel. Otherwise, the no branch is taken, the measured power levels are saved, as indicated by block 704, and portions of the receiver power-down for a time period, as indicated by block 708. (It should be understood that the portions of the receiver may be repowered responsive to execution of other algorithms during such time period. For instance, the receiver may be repowered for purposes of monitoring signals transmitted by a base site of the less-than-most-desired network to which the receiver is initially tuned.)

After the time period elapses, the portions of the receiver powered-on again, and the power levels of the control signals transmitted upon the control channels are re-measured, as indicated by block 708. The second subset of control channels is formed, as indicated by block 712, and an attempt to establish a down link with a transmitter in the first embodiment or a base station of a most-desired network in the second embodiment which transmits a control signal upon one of such channels is made, as indicated by block 716.

At decision block 720, a determination is made whether a communication down-link may be effectuated in the first embodiment or effectuated with a base station of the most-desired network in the second embodiment. If a down-link may be effectuated, the yes branch is taken to block 724, and the tuning frequency of the receiver tuning circuitry is tuned to the frequency of the selected control channel. Otherwise the no branch is taken, the measured power levels are saved to update the stored power levels thereby, as indicated by block 728, and the portions of the receiver power-down for a time period, as indicated by block 732.

After the time period elapses, a determination is made, indicated by block 736, as to whether or not an extended time period since first measuring the power levels of the control signals (at block 684) has transpired. If so, the yes branch is taken to block 684, and the process is repeated. Otherwise, the no branch is taken to block 768, and the power levels of the control signals are re-measured.

Figure 7:
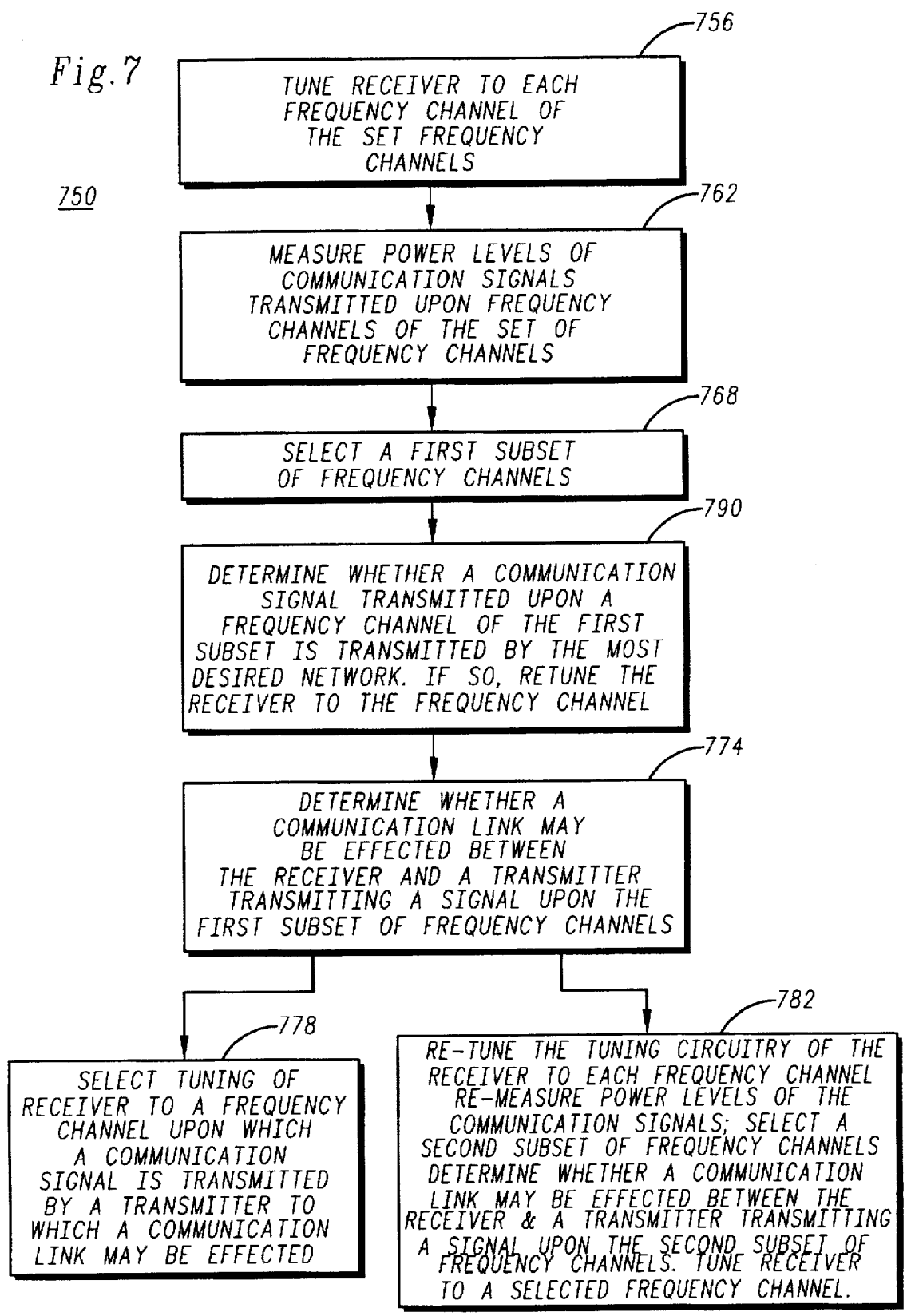
FIG. 7 is a logical flow diagram listing the method steps of a preferred embodiment of the present invention.

Turning next to the logical flow diagram of FIG. 7, the method steps of the preferred embodiment of the method, referred to generally by reference numeral 750, of the present invention are listed. Method 750 according to the first embodiment selects tuning of tuning circuitry of a radio receiver to a frequency channel of a set of frequency channels defined upon a frequency band. Each frequency channel of the set of frequency channels is suitable for transmission thereupon a communication signal transmitted by a transmitter of a group of remotely-positioned transmitters. Method 750, according to the second embodiment, retunes a tuning frequency of tuning circuitry of a radio receiver to receive a communication signal transmitted upon a frequency channel of a set of frequency channels by a transmitter of a most-desired network of transmitters when the radio receiver is initially tuned to receive a communication signal transmitted by a transmitter of a less-than-most desired network of transmitters.

First, and as indicated by block 756, the tuning circuitry of the radio receiver is tuned to each frequency channel of the set of frequency channels defined upon the frequency band.

Next, and as indicated by block 762, the power levels of the communication signals transmitted upon individual ones of the frequency channels of the set of frequency channels are measured.

Next, and as indicated by block 768, the frequency channels upon which communication signals are transmitted of measured power levels beyond a minimum power level are selected to form a first subset of frequency channels.

Next, and as indicated by block 774, according to the first embodiment, a determination is made as to whether a communication link may be effectuated between the radio receiver and individual ones of the transmitters which transmits communication signals upon the frequency channels of the first subset of frequency channels.

Then, either, as indicated by blocks 778 and 782, tuning of the tuning circuitry of the radio receiver is selected to a frequency channel upon which a communication signal transmitted by a transmitter to which a communication link with the radio receiver may be effectuated is selected, or 1.) the tuning circuitry of the radio receiver is re-tuned to each frequency channel of the set of frequency channels, 2.) the power levels of the communication signals are re-measured, 3.) a second subset of frequency channels is formed, and 4.) tuning of the radio receiver to a frequency channel of the second subset of frequency channels is selected when a communication link may be effectuated therewith.

Alternatively, and as indicated by block 790 according to the second embodiment, a determination is made as to whether a communication signal transmitted upon a frequency channel of the first subset of frequency channels is transmitted by a transmitter of the most-desired network of transmitters. If a determination is made that the communication signal is transmitted by the transmitter of the most-desired network of transmitters, tuning of the frequency of the tuning circuitry of the radio receiver is selected to the frequency channel upon which the communication signal is transmitted by the transmitter of the most-desired network of transmitters.

Figure 8:
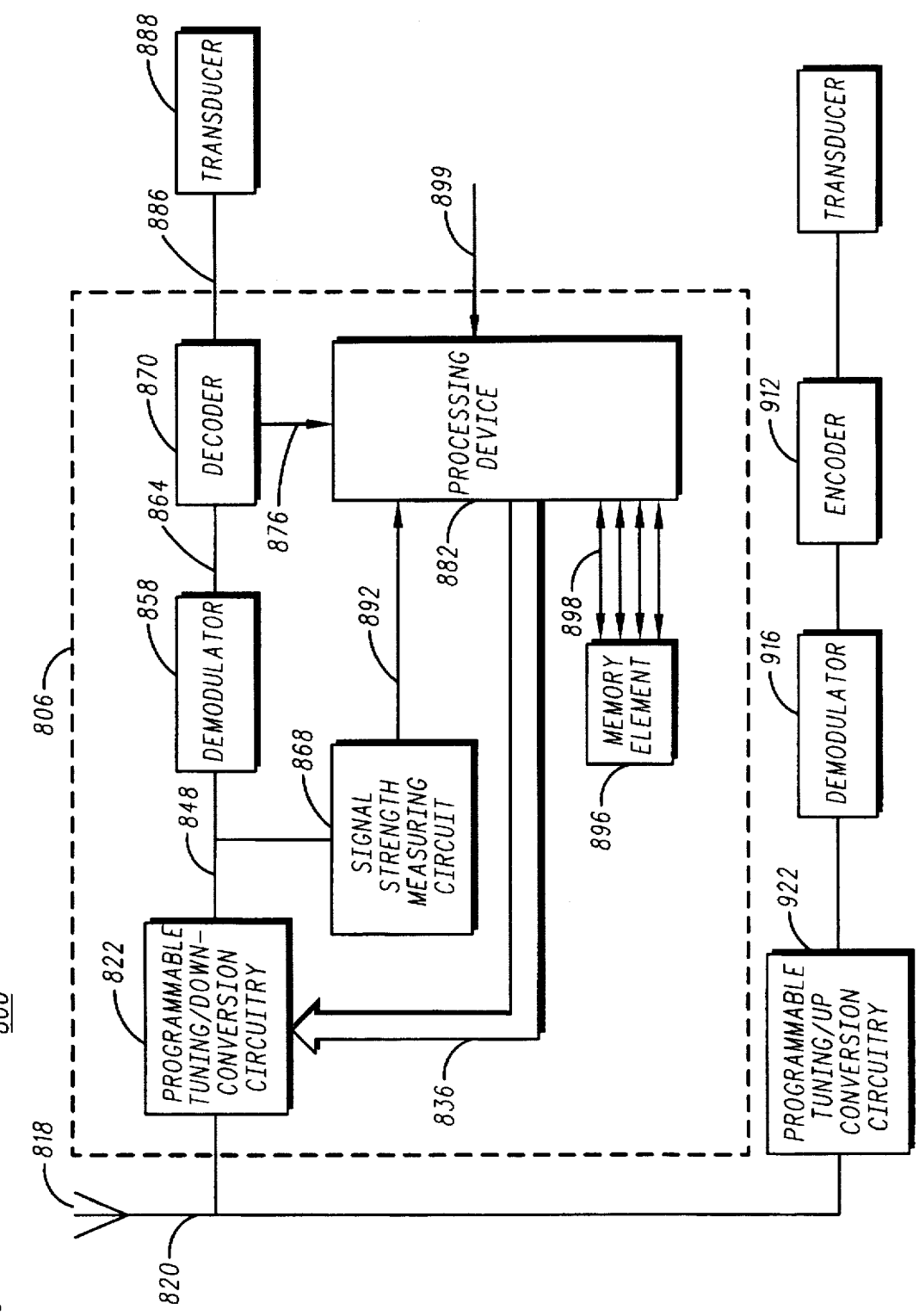
FIG. 8 is a block diagram of a radio transceiver including the circuitry of the preferred embodiment of the present invention.

Finally, turning to the block diagram of FIG. 8, a radio transceiver, such as a radiotelephone, referred to generally by reference numeral 800, is shown. Transceiver 800 includes circuit 806, comprising the elements within the block shown in hatch, of a preferred embodiment of the present invention. Circuit 806 corresponds to circuit 400 of FIG. 3. The receiver portion of radio transceiver 800 is similar to radio receiver 406 shown in the block diagram of FIG. 3, and operation thereof will not again be described in detail. Examination of the receiver portion of radio transceiver 800 indicates that radio transceiver 800 includes antenna 818 to which line 820 is connected for interconnecting antenna 818 to programmable tuning/down conversion circuitry 822. Operation of circuitry 822 is controlled by input signal supplied thereto on lines 836. Circuitry 822 generates a signal on line 848 which is coupled to demodulator circuitry 858 and signal strength measuring circuitry 868. Demodulator circuitry 858 generates a demodulated signal on line 864 which is supplied to decoder 870.

Decoder 870 generates a signal on line 876 which is coupled to an input of processing device 882. Decoder 870 further generates a decoded signal on line 886 which is supplied to transducer 888, such as a speaker. Signal strength measuring circuit 868 generates a signal which is supplied to processing device 482 by way of line 892. Memory element 896 is further coupled to processing device 882, thereby way of lines 898, and line 899 provides an external input to the processing device 882.

Radio transceiver 800 is further shown to include a transmit portion having component portions shown generally to include a transducer, such as a microphone, 908, encoder 912, modulator 916, and programmable tuning-up-conversion circuitry 922. Operation of circuitry 922 is controlled by input signals supplied thereto by way of line 928. Circuitry 922 generates a signal on line 934 which is coupled to antenna 818 to permit transmission of information signals therefrom.

While the present invention has been described in connection with the preferred embodiments shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. A method for camping a radio receiver to receive a communication signal transmitted upon a channel of a set of channels defined upon a frequency band by a transmitter of a group of remotely-positioned transmitters, said method comprising the steps of:

(a) measuring power levels of communication signals transmitted upon individual ones of channels of a set of channels;

(b) selecting channels upon which communication signals are transmitted of measured power levels above at least a minimum power level to form a first subset of channels;

(c) after said step (b) determining whether a communication link is effectuated with transmitters which transmit communication signals upon the channels of the first subset of channels;

(d) storing measured power levels of channels;

(e) re-measuring power levels of communication signals transmitted upon the individual ones of the channels of the set of channels, (f) selecting channels re-measured in said step (e) having communication signals exhibiting power levels above a level related to the previously measured power levels stored in said step (d), (g) forming a second subset of channels using at least those channels selected in step (f), (h) determining whether a communication link is effectuated between the radio receiver and individual ones of the transmitters which transmit communication signals upon the channels of the second subset of channels, (i) when said step (f) determines that a communication link is effectuated, camping the radio receiver to a channel of the second subset of channels, and (j) when said step (i) determines that a communication link is not effectuated, returning to step (d) of storing.

2. The method of claim 1 wherein the channels are frequency channel and wherein the method further comprises the step of (i) sequentially tuning circuitry of the radio receiver to each frequency channel of the set of frequency channels defined upon the frequency band.

3. The method of claim 1 wherein said step (a) of measuring power levels comprises the step of (a1) measuring amplitudes of signals representative of the communication signals upon the individual ones of the channels.

4. The method of claim 1 wherein said step (d) comprises the step of (d1) storing values of measured power levels of individual ones of the channels measured during said step (a).

5. The method of claim 4 wherein said step (d1) of storing comprises the substep of (d1i) storing the measured power levels in a memory element.

6. The method of claim 1 wherein the minimum power level utilized during said step (b) of selecting channels to form the first subset of channels selects channels above a predetermined, absolute-valued noise floor.

7. The method of claim 1 wherein the minimum power level utilized during said step (b) is of a value corresponding to a predetermined value above a measured power level of the measured power levels of lowest magnitude.

8. The method of claim 1 wherein said step (h) of determining when a communication link is effectuated comprises the substeps of:

(h1) decoding the communication signals transmitted upon the channels of the selected subset of channels to form decoded signals; and (h2) comparing portions of the decoded signal with data stored at the radio receiver.

9. The method of claim 1 further comprising the step of (k) delaying the re-measuring of said step (e) for a time period based on a time necessary to measure and attempt to establish a communication link.

10. The method of claim 1 wherein said step (f) of selecting channels which exhibit power levels above a level related to previously measured power levels comprises the substep of (f1) selecting channels upon which communication signals having measured power levels beneath a predetermined absolute-valued noise floor during the measuring of said step (a) exhibit an increase in power levels measured during the re-measuring of said step (c) to be above the predetermined, absolute-valued noise floor.

11. The method of claim 1 wherein said step (f) of selecting channels which exhibit power levels above a level related to previously measured power levels comprises the substep of (f1) selecting channels upon which communication signals exhibit power level increases above a predetermined amount of power level rise.

12. The method of claim 1, further comprising the steps of:

(k) initially camping the radio receiver to receive a communication signal transmitted by a transmitter of a network of remotely-positioned transmitters on one of the first subset of channels;

(l) when said step (k) initially camps to a less-than-most desired network of remotely-positioned transmitters, performing the steps of (d) through (j) to determine if the radio receiver later becomes in range of the most desired network of remotely-positioned transmitters and camping to a transmitter of the most desired network in said step (i).

13. The method of claim 1 wherein said step (f) of selecting channels which exhibit power levels above a level related to previously measured power levels comprises the substep of (f1) selecting channels upon which communication signals exhibit a power level above a predetermined value above a measured power level of the measured power levels of lowest magnitude.

14. In a cellular communication system having a plurality of spaced-apart base stations wherein each of the spaced-apart base stations transmits communication signals on a control channel of a set of control channels defined upon a frequency band, and a radio transceiver having tuning circuitry and being operative to receive a communication signal transmitted upon a control channel by a base station of the plurality of base stations when positioned within the transmission range of the base station, a method for tuning the tuning circuitry of the radio transceiver to a frequency channel of the set of frequency channels, said method comprising the steps of:

(a) measuring power levels of communication signals transmitted upon individual ones of frequency channels of a set of frequency channels;

(b) selecting frequency channels upon which communication signals are transmitted of measured power levels above at least a minimum power level to form a first subset of frequency channels;

(c) storing measured power levels of frequency channels;

(d) re-measuring power levels of communication signals transmitted upon the individual ones of the frequency channels of the set of frequency channels, (e) selecting frequency channels re-measured in said step (d) having communication signals exhibiting power levels above a level related to the previously measured power levels stored in said step (c), (f) forming a second subset of frequency channels using at least those frequency channels selected in step (e), (g) determining whether a communication link is effectuated between the radio receiver and individual ones of the transmitters which transmit communication signals upon the frequency channels of the second subset of frequency channels, and (h) when said step (g) determines that a communication link is effectuated, selecting tuning of the radio receiver to a frequency channel of the second subset of frequency channels.

15. The method of claim 14, further comprising the steps of:

(i) after said step (b), initially camping the radio receiver to receive a communication signal transmitted by a basestation of a network on one of the first subset of frequency channels;

(j) when said step (c) initially camps to a less-than-most desired network of remotely-positioned transmitters, performing the steps of (d) through (h) to determine if the radio receiver later becomes in range of the most desired network and camping to a transmitter of the basestation of the most desired network in said step (h).

16. A method for operating a radio receiver to receive a communication signal transmitted upon a channel of a set of channels defined upon a frequency band by a transmitter of a group of remote transmitters, said method comprising the steps of:

(a) initially measuring power levels of communication signals transmitted upon individual ones of channels of a set of channels;

(b) storing measured power levels of channels;

(c) re-measuring power levels of communication signals transmitted upon the channels, (d) selecting channels re-measured in said step (c) having communication signals exhibiting power levels above a level related to the previously measured power levels stored in said step (b), (e) forming a subset of channels using at least those channels selected in step (d), (f) attempting to decode data on the channels of the subset to determine whether a communication link is effectuated between the radio receiver and individual ones of the transmitters, and (g) when said step (f) determines that a communication link is effectuated, operating the radio receiver on a decodable channel.

17. The method of claim 16, further comprising the step of (h) when said step (g) determines that a communication link is not effectuated, returning to step (b) of storing.

18. The method of claim 16 wherein the channels are frequency channels and wherein the method further comprises the step of (h) sequentially tuning circuitry of the radio receiver to each frequency channel of the set of channels defined upon the frequency band.

19. The method of claim 16 wherein said step of measuring power levels measures amplitudes of signals representative of the communication signals upon the individual ones of the channels.

20. The method of claim 16 wherein said step (b) comprises the step of (b1) storing values of measured power levels of individual ones of the channels measured.

21. The method of claim 20 wherein said step (b1) of storing comprises the substep of (b1i) storing the measured power levels in a memory element.

22. The method of claim 1 wherein said step (f) of attempting to decode data on the channels of the subset to determine when a communication link is effectuated comprises the substeps of:

(f1) decoding the communication signals transmitted upon the channels of the subset of channels to form decoded signals; and (f2) comparing portions of the decoded signal with data stored at the radio receiver.

23. The method of claim 16, further comprising the step of:

(h) selecting channels initially measured in said step (a) upon which communication signals are transmitted of measured power levels above at least a minimum power level to form an initial subset of channels, and (i) after said step (h), demodulating to determine whether a communication link is effectuated with transmitters which transmit communication signals upon the channels of the initial subset of channels.

24. The method of claim 23 wherein the minimum power level utilized during said step (h) of selecting channels to form the first subset of channels selects channels above a predetermined, absolute-valued noise floor.

25. The method of claim 23 wherein the minimum power level utilized during said step (h) is of a value corresponding to a predetermined value above a measured power level of the measured power levels of lowest magnitude.

26. The method of claim 16 further comprising the step of (h) delaying the re-measuring of said step (c) for a time period based on a time necessary to measure and attempt to establish a communication link.

27. The method of claim 16 wherein said step (d) of selecting channels which exhibit power levels above a level related to previously measured power levels stored in said step (b) comprises the substep of (d1) selecting channels upon which communication signals having previously measured and stored power levels beneath a predetermined absolute-valued noise floor exhibit an increase in power levels measured during the re-measuring of said step (c) to be above the predetermined, absolute-valued noise floor.

28. The method of claim 16 wherein said step (d) of selecting channels which exhibit power levels above a level related to previously measured power levels stored in said step (b) comprises the substep of (d1) selecting channels upon which communication signals exhibit power level increases above a predetermined amount of power level rise.

29. The method of claim 16 wherein said step (d) of selecting channels which exhibit power levels above a level related to previously measured power levels stored in said step (b) comprises the substep of (d1) selecting channels upon which communication signals exhibit a power level, when compared against a previously measured and stored power level, rises above a predetermined value above a measured power level of the measured power levels of lowest magnitude.

30. The method of claim 16, further comprising the steps of:

(h) initially operating the radio receiver to receive a communication signal transmitted by a transmitter of a network of remotely-positioned transmitters;

(i) when said step (h) initially operates on a less-than-most desired network of remotely-positioned transmitters, performing the steps of (c) through (g) to determine if the radio receiver later becomes in range of the most desired network of remotely-positioned transmitters and operating the radio receiver to receive a decodable channel from a transmitter of the most desired network.

* * * * *